US 9,319,489 B2

(12) United States Patent
Pawar et al.

(10) Patent No.: US 9,319,489 B2
(45) Date of Patent: *Apr. 19, 2016

(54) NEARSTORE COMPRESSION OF DATA IN A STORAGE SYSTEM

(71) Applicant: NetApp, Inc., Sunnyvale, CA (US)

(72) Inventors: Dnyaneshwar Pawar, Bangalore (IN); Subramaniam V. Periyagaram, San Jose, CA (US); Sandeep Yadav, Santa Clara, CA (US)

(73) Assignee: NetApp, Inc., Sunnyvale, CA (US)

( * ) Notice: Subject to any disclaimer, the term of this patent is extended or adjusted under 35 U.S.C. 154(b) by 159 days.

This patent is subject to a terminal disclaimer.

(21) Appl. No.: 14/026,726

(22) Filed: Sep. 13, 2013

(65) Prior Publication Data
US 2014/0081929 A1 Mar. 20, 2014

Related U.S. Application Data

(63) Continuation of application No. 12/492,069, filed on Jun. 25, 2009, now Pat. No. 8,554,745.

(51) Int. Cl.
| G06F 12/00 | (2006.01) |
|---|---|
| H04L 29/06 | (2006.01) |
| G06F 17/27 | (2006.01) |
| G06F 17/30 | (2006.01) |
| G06F 12/08 | (2006.01) |
| H03M 7/30 | (2006.01) |
| G06F 7/00 | (2006.01) |

(52) U.S. Cl.
CPC ............ *H04L 69/04* (2013.01); *G06F 12/0804* (2013.01); *G06F 12/0868* (2013.01); *G06F 17/27* (2013.01); *G06F 17/30867* (2013.01); *H03M 7/30* (2013.01); *G06F 2212/2022* (2013.01); *G06F 2212/214* (2013.01); *G06F 2212/314* (2013.01); *G06F 2212/401* (2013.01)

(58) Field of Classification Search
CPC .......................... G06F 2212/401; G06F 12/08
See application file for complete search history.

(56) References Cited

U.S. PATENT DOCUMENTS

| 5,298,895 | A |   | 3/1994 | Van Maren |
| 5,357,614 | A | * | 10/1994 | Pattisam et al. ................. 710/68 |
| 5,394,534 | A | * | 2/1995 | Kulakowski et al. ......... 711/112 |
| 5,652,857 | A |   | 7/1997 | Shimoi et al. |
| 6,023,709 | A | * | 2/2000 | Anglin et al. |
| 6,078,541 | A | * | 6/2000 | Kitagawa .............. G06F 9/4401 365/230.01 |
| 6,360,300 | B1 |   | 3/2002 | Corcoran et al. |

(Continued)

OTHER PUBLICATIONS

"U.S. Appl. No. 12/492,069 Final Office Action", Dec. 15, 2011, 37 pages.

(Continued)

*Primary Examiner* — Sangwoo Ahn
(74) *Attorney, Agent, or Firm* — Gilliam IP PLLC

(57) ABSTRACT

A network adapter receives a request to store a data block. The data block is sent from the network adapter to a compression module. The compression module generates a compressed data block from the data block. The compressed data block or a reference to the compressed data block is stored in a buffer cache. The compressed data block is stored in nonvolatile memory. It is determined that the compressed data block should be flushed a storage device. In response to determining that the compressed data block should be flushed to the storage device, the compressed data block is flushed from the nonvolatile memory to the storage device.

20 Claims, 6 Drawing Sheets

(56) References Cited

U.S. PATENT DOCUMENTS

| | | |
|---|---|---|
| 6,427,149 B1 | 7/2002 | Rodriguez et al. |
| 6,449,689 B1 | 9/2002 | Corcoran et al. |
| 6,657,562 B2 | 12/2003 | Radermacher et al. |
| 6,879,266 B1 | 4/2005 | Dye et al. |
| 6,959,300 B1 | 10/2005 | Caldwell |
| 7,395,355 B2 | 7/2008 | Afergan et al. |
| 7,620,870 B2 | 11/2009 | Srinivasan et al. |
| 7,962,700 B2 | 6/2011 | Franaszek et al. |
| 7,987,161 B2 | 7/2011 | Williams et al. |
| 8,285,687 B2 | 10/2012 | Voll et al. |
| 2003/0229761 A1* | 12/2003 | Basu et al. ............ 711/134 |
| 2005/0071579 A1 | 3/2005 | Luick |
| 2005/0192994 A1 | 9/2005 | Caldwell et al. |
| 2005/0219075 A1 | 10/2005 | Storer et al. |
| 2007/0005901 A1 | 1/2007 | Kellar |
| 2007/0263876 A1 | 11/2007 | De Waal et al. |
| 2008/0052687 A1 | 2/2008 | Gonzales-tuchmann et al. |
| 2008/0091698 A1 | 4/2008 | Cook et al. |
| 2008/0098003 A1 | 4/2008 | Dias et al. |
| 2008/0183739 A1 | 7/2008 | Pai et al. |

OTHER PUBLICATIONS

"U.S. Appl. No. 12/492,069 Final Office Action", Dec. 3, 2012, 49 pages.

"U.S. Appl. No. 12/492,069 Office Action", Aug. 10, 2011, 34 pages.

"U.S. Appl. No. 12/492,069 Office Action", Jun. 20, 2012, 43 pages.

* cited by examiner

NEARSTORE COMPRESSION OF DATA IN A STORAGE SYSTEM

RELATED APPLICATIONS

This present application is a continuation of co-pending U.S. patent application Ser. No. 12/492,069, filed Jun. 25, 2009, which is assigned to the same assignee as the present application.

FIELD OF INVENTION

The present invention relates to storage systems, and more particularly, to compression of data in a storage server.

COPYRIGHT NOTICE/PERMISSION

A portion of the disclosure of this patent document contains material which is subject to copyright protection. The copyright owner has no objection to the facsimile reproduction by anyone of the patent document or the patent disclosure as it appears in the Patent and Trademark Office patent file or records, but otherwise reserves all copyright rights whatsoever. The following notice applies to the software and data as described below and in the drawings hereto: Copyright© 2009, NetApp, Inc., All Rights Reserved.

BACKGROUND

A data storage system typically includes storage devices and one or more network storage servers or storage appliances. A storage server may provide services related to the organization of data on storage devices, such as disks. A client may connect to the storage server via a network, for example, to request data to be stored on the storage devices and to request data to be retrieved from the storage devices. Some of these storage servers are commonly referred to as filers or file servers. The storage server may be implemented with a special-purpose computer or a general-purpose computer. Such storage systems typically use file systems to organize and provide easy access to the files they contain.

The speed at which a data storage system can handle the storage and retrieval of data depends on such factors as the amount of memory available to the data storage system. A storage server in the storage system may use such memory, for example, to store data before writing the data to a storage device, or while performing requested operations on data retrieved from a storage device. As the number and capacity of storage devices in the data storage system increase, the ability of the data storage system to handle larger quantities of data may be limited by the amount of available memory.

One possible solution is to simply increase the amount of memory available to the data storage system by physically including additional memory modules. However, such memory modules may be very costly, such that adding memory modules to the system may not result in an improvement in performance commensurate with the cost of adding the memory.

In other cases, increasing the size of the memory may not be possible because other limitations of the storage server. For example, additional memory may not be addressable by an operating system beyond a particular address, or a physical slot for installing the memory may not be available on the storage server.

SUMMARY OF THE INVENTION

In some embodiments, a network adapter of a storage controller receives a request to store a data block. The data block is sent from the network adapter to a compression module of the storage controller. In response to receiving the data block from the network adapter, the compression module generates a compressed data block from the data block. The compressed data block is stored in a buffer cache and nonvolatile memory. The storage controller comprises the buffer cache and the nonvolatile memory. It is determined that the compressed data block should be flushed to a physical storage device coupled with the storage controller. In response to determining that the compressed data block should be flushed to the physical storage device, the compressed data block is flushed from the nonvolatile memory to the physical storage device.

By compressing data to be stored in system memory of a storage server, the amount of data that can be processed during a given time period by a data storage system is increased. Furthermore, an increase in performance can be achieved at a lower cost, since the cost of additional physical system memory modules can be avoided.

The present invention is described in conjunction with systems, clients, servers, methods, and computer-readable media of varying scope. In addition to the aspects of the present invention described in this summary, further aspects of the invention will become apparent by reference to the drawings and by reading the detailed description that follows.

BRIEF DESCRIPTION OF THE DRAWINGS

The present invention is illustrated by way of example and not limitation in the figures of the accompanying drawings, in which like references indicate similar elements and in which.

DETAILED DESCRIPTION

In the following detailed description of embodiments of the invention, reference is made to the accompanying drawings in which like references indicate similar elements, and in which is shown by way of illustration specific embodiments in which the invention may be practiced. These embodiments are described in sufficient detail to enable those skilled in the art to practice the invention, and it is to be understood that other embodiments may be utilized and that logical, mechanical, electrical, functional, and other changes may be made without departing from the scope of the present invention. The following detailed description is, therefore, not to be taken in a limiting sense, and the scope of the present invention is defined only by the appended claims.

By compressing data to be stored in system memory of a storage server, the amount of data that can be processed during a given time period by a data storage system is increased. Furthermore, the increase in performance can be achieved at a lower cost, since the cost of additional physical system memory modules can be avoided.

A portion of system memory may be used as a buffer cache to store data that is likely to be used, such as data that has recently been accessed, or data that has frequently been accessed in the past. However, since the buffer cache size is limited by system memory, increasing the buffer cache to increase performance may result in added hardware costs, and may not be feasible. The capacity of the buffer cache is virtually increased by compressing the data in the buffer cache and only decompressing the data to perform operations on the data or to send the data to a client. The process of decompressing compressed data fetched from the buffer cache may still be much faster than reading uncompressed data from a physical storage device, such as a disk. This is because reading data from a disk may include the time consuming processes of locating a disk, seeking to a data location in the disk, and fetching the data from disk to system memory.

A storage server may also include a nonvolatile memory (NVM) for storing data received from clients before the data is stored in a physical storage device. The capacity of the NVM is virtually increased by compressing data received from the client before storing the compressed data on the NVM.

Figure 1:
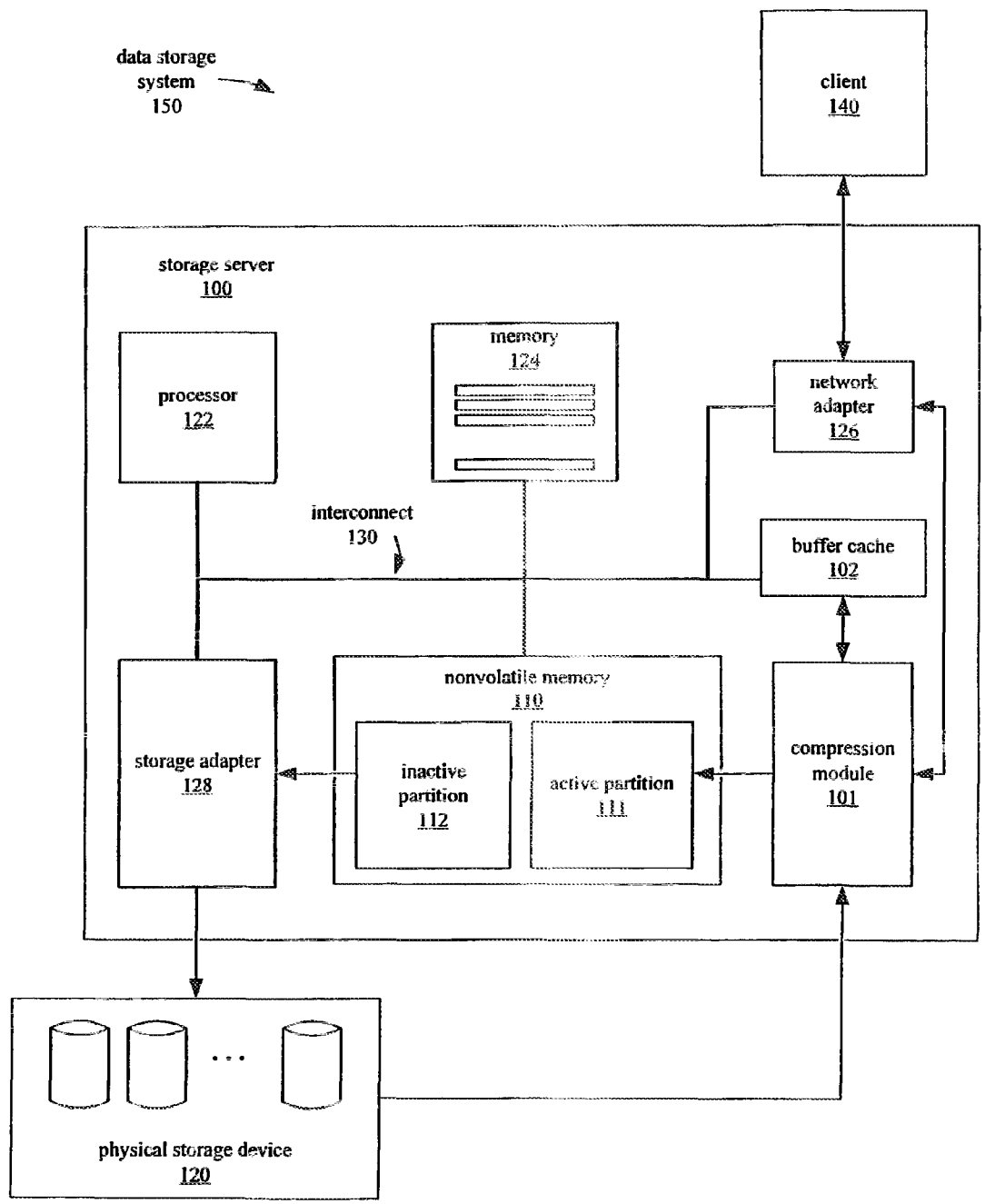
FIG. 1 is a block diagram illustrating one embodiment of a storage server.

FIG. 1 illustrates one embodiment of a data storage system including a client, a storage server, and at least one physical storage device. The data storage system 150 includes a client 140 connected to a storage server 100. Storage server 100 is further connected to physical storage device 120.

The storage server 100 includes a processor 122, a memory 124, a network adapter 126, and a storage adapter 128, which are coupled to each other via an interconnect 130. In one embodiment, the storage server 100 is within a network and the network adapter 126 interfaces with the network (not shown) to communicate with client 140. The network may include a local area network (LAN), or a wide area network (WAN), etc. Data is transmitted between the storage server 100 and the network via the network adapter 126. When data is received, the network adapter 126 may forward the data to the storage adapter 128, the memory 124, or the processor 122.

The storage server 100 is connected to at least one physical storage device 120, and may also be connected to any number of additional physical storage devices making up a local storage subsystem. For example, the physical storage device 120 may be a data storage device, such as a hard disk drive, or may also be a Redundant Array of Inexpensive Disks (RAID). The local storage subsystem of the storage server 100 includes the data storage devices accessible to the storage server 100.

In one embodiment, the storage server 100 may have a distributed architecture. For example, the storage server 100 may include a separate N-("network") blade or module and D-(disk) blade or module (not shown). In such an embodiment, the N-blade is used to communicate with client 140, while the D-blade includes the file system functionality and is used to communicate with the physical storage device 120. The N-blade and D-blade communicate with each other using an internal protocol. In one embodiment, the N-blade performs similar functions as the network adapter 126, while the D-blade performs similar functions as the storage adapter 128. In one embodiment, the D-blade also includes a network adapter for connecting to other D-blades or N-blades. Alternatively, the storage server 100 may have an integrated architecture, where the network and data components are all contained in a single unit. The storage server 100 further may be coupled through a switching fabric to other similar storage servers (not shown) which have their own local storage subsystems. In this way, all of the storage subsystems can form a single storage pool, to which any client of any of the storage servers has access.

In one embodiment, the processor 122 reads instructions from the memory 124 and executes the instructions. The memory 124 may include any of various types of memory devices, such as, for example, random access memory (RAM), read-only memory (ROM), flash memory, one or more mass storage devices (e.g., disks), etc. In one embodiment, the memory 124 stores instructions of various software running on the storage server 100, such as a Redundant Array of Inexpensive Disks (RAID) engine, an operating system, storage subsystems (e.g., driver of disk drives, driver of tape drives, etc.), Network File System (NFS) applications, Network Internet Protocol (IP) Driver, etc. The processor 122 responds to requests from client machines, the network management station, or other storage servers and organizes data on the storage devices (e.g., disks) coupled to the storage server 100. The storage server 100 interfaces with the storage devices via the storage adapter 128.

Storage server 100 also includes a compression module 101, a buffer cache 102, and a nonvolatile memory 110. The nonvolatile memory 110 includes an active partition 111 and an inactive partition 112.

When data is written to the storage server by a client 140, the data can be compressed at the network or protocol layer and then passed in compressed form to the storage server file system. Thus, in one embodiment, the majority of data handled by the file system is compressed data, such that compressed data is stored in the buffer cache 102 and physical storage device 120.

The compression of data may be performed by a compression module 101, which receives data and compresses the data according to a compression algorithm. For example, the compression module 101 may receive a data block from another component in storage server 100, such as network adapter 126. Compression module 101 compresses the received data block by applying a compression algorithm (i.e., gzip, run length encoding, LZW, etc.) and sends the compressed data block to another component in storage server 100.

In one embodiment, the compression module 101 compresses a received data block into a compression group. Such a compression group includes a group of data blocks that are compressed together using the same compression algorithm. For example, eight data blocks containing four kb of data per block (32 kb of data) may be compressed together into a compression group that occupies only 24 kb of space (equivalent to six data blocks). In one embodiment, the compression group is treated as a single unit. For example, the compression module 101 copies only whole compression groups, rather than individual blocks of compressed data when copying data to other components, such as the buffer cache 102.

In one embodiment, the compression module 101 compresses data received from client 140. For example, client 140 may transmit a data block, along with a request to store the data block, to network adapter 126. Network adapter 126 forwards the data block to compression module 101. Compression module 101 compresses the data block into a compression group and sends the compression group to another component in the storage server, such as the buffer cache 102 or the nonvolatile memory 110.

In one embodiment, the compression module 101 includes a software module that operates from program memory, such as memory 124, and is executed by processor 122. Alternatively, the compression module 101 may be implemented as a hardware module. For example, the compression module 101 may include one or more integrated circuit chips that perform all or part of the data compression. In one embodiment, the compression module 101 is implemented in a dedicated hardware module such as a Peripheral Component Interconnect (PCI) card. Such a hardware implementation of the compression module 101 may include its own processor and program memory separate from processor 122 and memory 124. A compression module implemented as a hardware module may also communicate with other components in the storage server through a bus protocol such as PCI, Industry Standard Architecture (ISA), Small Computer Systems Interface (SCSI), or other bus protocol.

In one embodiment, a hardware module used to implement the compression module 101 also performs other functions, such as encryption and fingerprinting of data. The module may, for example, receive a data block, encrypt and compress the data block, generate a fingerprint for the data block, and then return the compressed and encrypted data block to another component in the storage server 100.

The storage server 100 also includes a buffer cache 102 that is connected to the compression module 101. In one embodiment, the buffer cache 102 is a fast memory that stores compressed data received from the compression module 101. The compressed data stored in the buffer cache 102 may be stored in compression groups.

In one embodiment, the data stored in buffer cache 102 may include a data block received from client 140. For example, client 140 may send a data block that is received at network adapter 126, transmitted to compression module 101, compressed into a compression group by compression module 101, and stored in buffer cache 102 in compressed form.

In one embodiment, the buffer cache 102 also stores data that has been retrieved from physical storage device 120. For example, the client 140 may request a data block from physical storage device 120 and the requested data block may be stored in buffer cache 102 in conjunction with returning the data block to the client 140. In one embodiment, the data block is stored on the physical storage device 120 in compressed form (i.e., in a compression group) and remains in compressed form when it is stored in the buffer cache 102.

In one embodiment, retrieving data from the buffer cache 102 is faster than retrieving data from the physical storage device 120. Thus, when storage server 100 receives a request for data from the client 140, the storage server 100 checks the buffer cache 102 for the data and serves the requested data to the client 140 from the buffer cache 102 if the requested data is in the buffer cache 102. In cases where the requested data is not in the buffer cache 102, the data may be retrieved from the physical storage device 120.

In one embodiment, the buffer cache 102 stores the requested data in compressed form, and the compressed data may further be stored in a compression group. When the storage server services a request for data by retrieving the data from the buffer cache 102, the compressed data is transmitted to the compression module 101, which decompresses the data. The decompressed data is returned to the client 140.

In one embodiment, this process of retrieving compressed data from the buffer cache 102, decompressing the data, and sending the data to the client 140 is still much faster than retrieving the requested data in uncompressed form from the physical storage device 120 and sending it to the client 140.

In addition to servicing requests for data, the buffer cache 102 can also be used when operations on data are requested. For example, if a logical OR operation of two data blocks is requested, the data blocks may be retrieved from the buffer cache 102 and decompressed by the compression module 101 so that the logical OR operation can be performed on the decompressed data blocks. In one embodiment, if the operation was requested by the client 140, the results of the operation are sent to the client 140 in uncompressed form. In one embodiment, the compression module 101 compresses the data resulting from the operation and stores the compressed result data in the buffer cache 102 for retrieval at a future time.

The storage server 100 also includes a non-volatile memory (NVM) 110. The NVM 110 includes an active partition 111 and an inactive partition 112. The NVM 110 stores data before the data is written to physical storage device 120. For example, client 140 may send a data block to be stored on the physical storage device 120. The data block is compressed by compression module 101 and stored in NVM 110. From the NVM 110, the data block is flushed to, or stored in, the physical storage device 120.

In one embodiment, the data stored in the NVM 110 is flushed to the physical storage device 120 at an event called a consistency point. For example, one or more clients, such as client 140, may send a number of data blocks to be stored on physical storage device 120. These data blocks are compressed by compression module 101 and stored in NVM 110 as they are received. The data blocks remain in the NVM 110 until they are flushed to the physical storage device 120 at the next consistency point.

In one embodiment, the process of flushing data from the NVM 110 to the physical storage device 120 uses active partition 111 and inactive partition 112. These partitions 111 and 112 store compressed data in compression groups. The partitions 111 and 112 are each created by allocating a portion of the memory in NVM 110 to each of the partitions 111 and 112. In one embodiment, the partitions 111 and 112 are equal in size.

Active partition 111 is connected to the compression module 101 so that the active partition 111 can receive compressed data from compression module 101. During normal operation of the storage server 100, the storage server 100 receives data to be written to physical storage device 120 from a client 140 and compresses the data, using compression module 101, into a compression group. The compressed data corresponding to the data received from the client 140 is stored in active partition 111.

At a consistency point, the data received from the client 140 that has been stored on the NVM 110 since the last consistency point is flushed to a physical storage device 120. In one embodiment, storage server 100 includes logic to swap the active partition 111 and the inactive partition 112, so that the active partition becomes inactive, and the inactive partition becomes active. After the swap occurs, at the time of the consistency point, the data that had been received from the client 140 since the last consistency point is now stored in the inactive partition 112.

In one embodiment, inactive partition 112 is configured to store compressed data in compression groups. Inactive partition 112 is further connected to physical storage device 120 so that inactive partition 112 can send compressed data to be stored in physical storage device 120. For example, the inactive partition 112 may send compressed data to storage adapter 128, which forwards the data to be stored on the physical storage device 120.

During the time that data is being flushed from the inactive partition 112 to the physical storage device 120, the active partition 111 receives and stores data received from client 140. Since the data received from the client 140 is being written to the active partition 111, the data on the inactive partition 112 is protected from modification by the incoming client data while the data on the inactive partition 112 is being flushed to the physical storage device 120.

In one embodiment, the physical storage device 120 is a device for storing data, such as a hard disk drive or an array of hard disks, such as a RAID. The physical storage device 120 is capable of storing data in compressed form, in compression groups.

Figure 2:
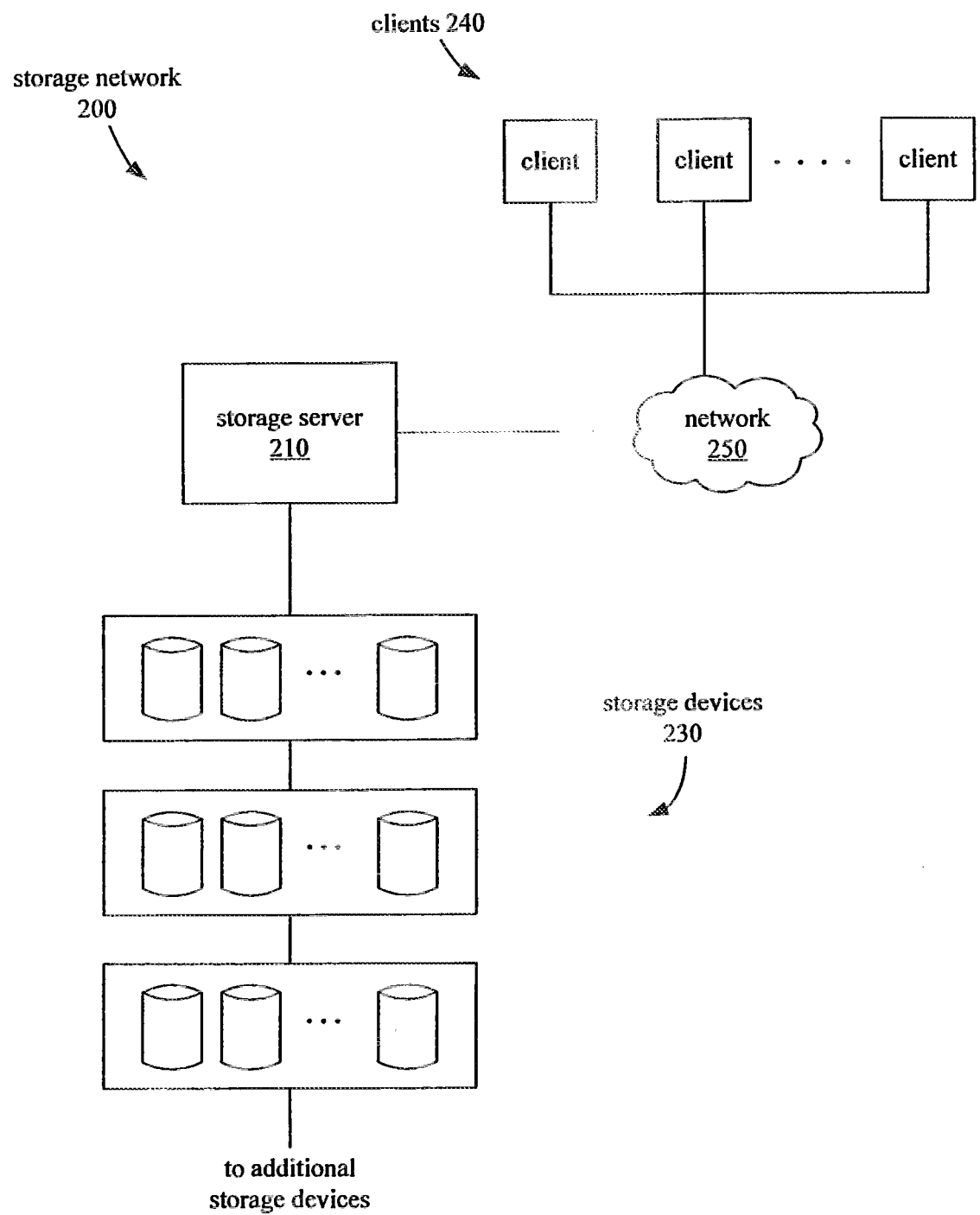
FIG. 2 is a block diagram illustrating one embodiment of a storage network.

FIG. 2 shows one embodiment of a storage network 200 in which a storage server, such as storage server 100, may be used. The storage network 200 includes a storage server 210, a network 250, a number of storage devices 230 coupled to the storage server 210, and a number of client machines 240 coupled to the storage server 210 via the network 250. The network 250 may include a wide area network (WAN), a local area network (LAN), etc. The storage devices 230 may include a number of disks organized in shelves. The disks may include one or more Redundant Array of Independent Disks (RAID) volumes.

Note that any or all of the components of storage network 200 and associated hardware may be used in various embodiments. However, it can be appreciated that other configurations of the data storage system may include some or all of the devices disclosed above.

In one embodiment, the storage network 200 includes a storage area network (SAN) to transmit read/write requests at the block level of the storage server 210. A block is the basic unit used to store data in a SAN system. In an alternative embodiment, the storage network 200 is a network-attached storage (NAS) system that transmits data at the file level. In the NAS system, complete files are retrieved instead of segments on a disk. The NAS system uses file access protocols to retrieve data, such as, for example, Network File System (NFS), or Common Internet File System (CIFS). The SAN and the NAS systems may be implemented in a single storage server or in separate storage servers.

Figure 3:
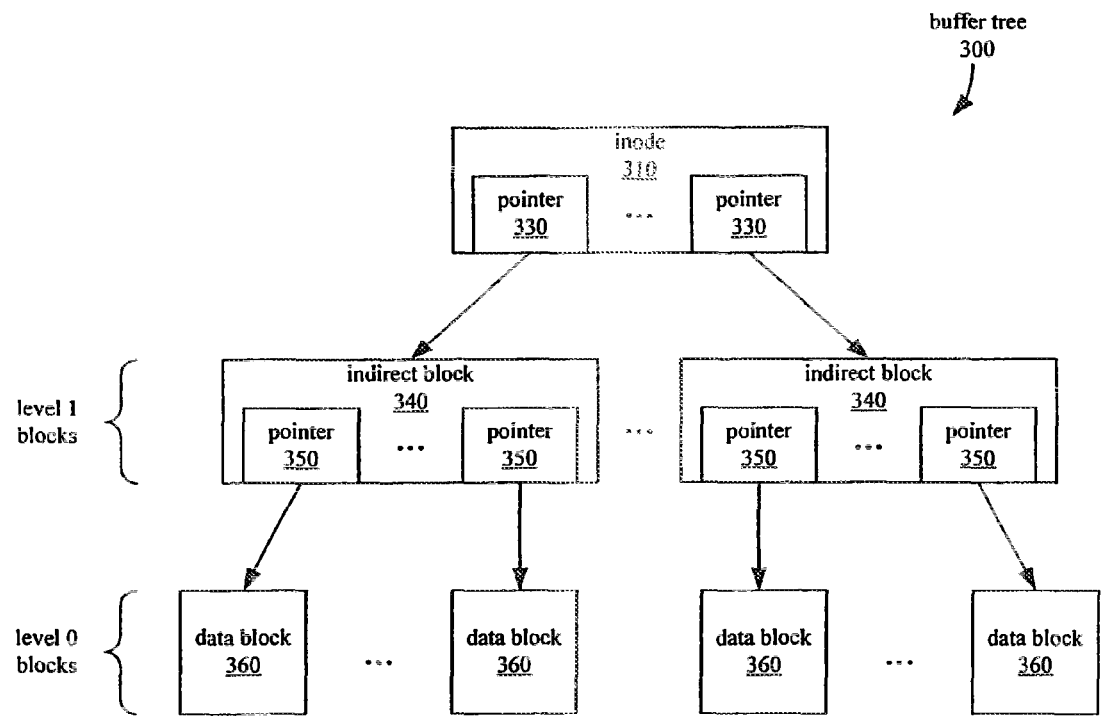
FIG. 3 illustrates a buffer tree for organizing data blocks, according to one embodiment.

FIG. 3 illustrates one embodiment of a buffer tree for storing data in a storage server, such as storage server 100. In one embodiment, data in the storage server may be organized into logical containers such as files. Alternatively, the logical containers may be data objects or datasets. A buffer tree, such as buffer tree 300, is an internal representation of the data blocks for a file. Each buffer tree has an inode 310 at its root (top-level). An inode 310 is a data structure used to store information, such as metadata, about a file, whereas the data blocks are structures used to store the actual data for the file. The information contained in an inode 310 may include, for example, ownership of the file, access permission for the file, size of the file, file type and references to locations on disk of the data blocks for the file. Each inode 310 also includes a "clone" flag which indicates whether the file is a clone of another file.

The references to the locations of the file data are provided by pointers 330 in the inode 310, which may point to indirect blocks 340 (also called "Level 1 blocks" or "L1 blocks"). The indirect blocks 340 contain pointers 350 that reference the actual data blocks 360 (also called "Level 0 blocks" or "L0 blocks"), depending upon the quantity of data in the file. Each pointer 330 or 350 may be embodied as a virtual block number (VBN) to facilitate efficiency among the file system and the RAID system when accessing the data on disks.

Additional levels of indirect blocks (e.g., level 2, level 3) may exist, depending upon the size of the file. That is, the data of the file are contained in direct (L0) blocks 360 and the locations of these blocks are stored in the indirect (L1) blocks 340 of the file. In one embodiment, each indirect block 340 can contain pointers to as many as 1,024 direct blocks. In one embodiment, files are organized using a "write anywhere" file system, so that these blocks may be located anywhere on a physical storage device and the buffer tree 300 may be used to indicate such locations. The logical (sequential) position of a direct (L0) block 360 within a file is indicated by the block's file block number (FBN).

Figure 4:
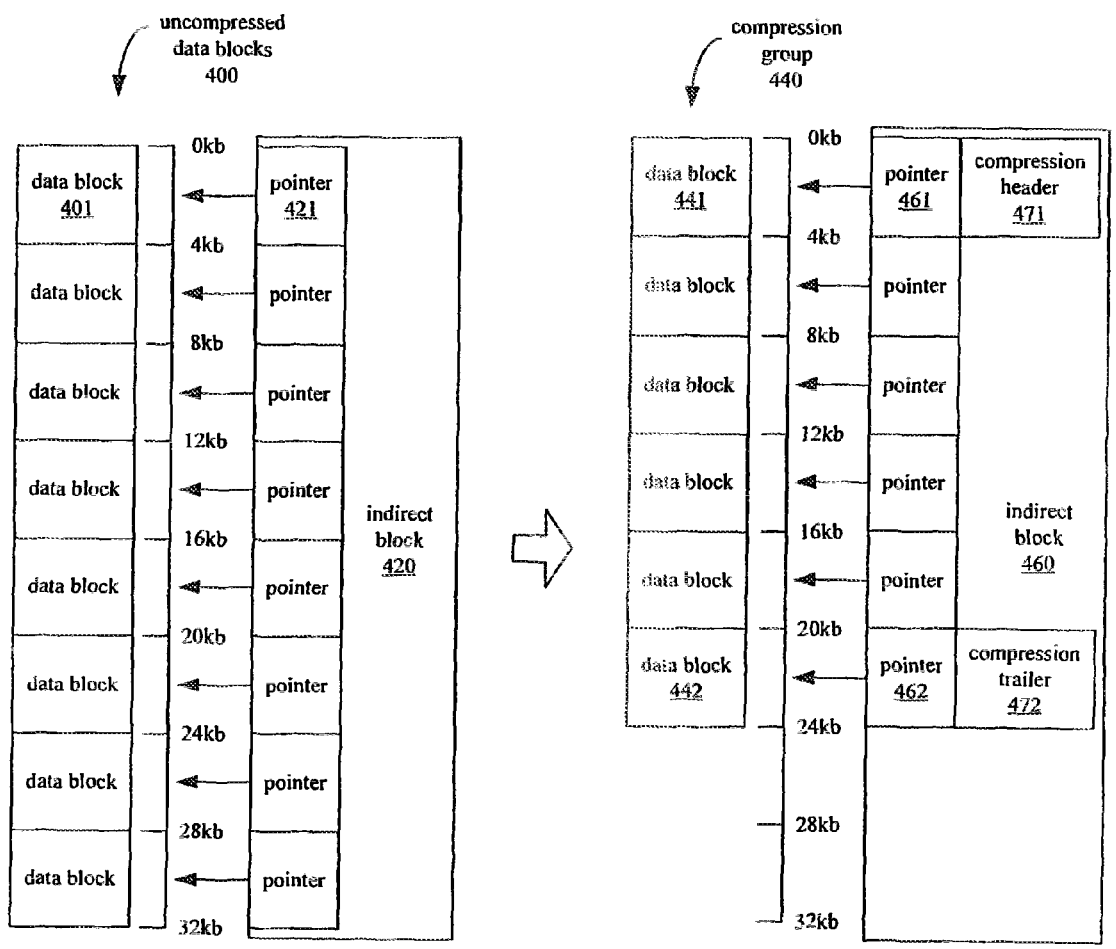
FIG. 4 illustrates data blocks in a compression group, according to one embodiment.

FIG. 4 is a diagram illustrating compression of data blocks into a compression group, according to one embodiment. Uncompressed data blocks 400 are direct (L0) blocks in a file system (as shown in FIG. 3), and each of the uncompressed data blocks 400 contains four kb of data so that a set of eight uncompressed data blocks contains 32 kb of data. Indirect block 420 contains a set of pointers, such as pointer 421, that each reference one of the uncompressed data blocks.

Compression group 440 contains a compressed version of the data from the uncompressed data blocks 400. In one embodiment, the data in uncompressed form occupies the 8 uncompressed data blocks 400. The same data occupies 6 data blocks, or 24 kb, in compressed form. In other embodiments, the data may be compressed at higher or lower compression ratios.

In one embodiment, the compression group includes a number of logically related blocks. For example, the blocks may be from the same file, or the compression group may include blocks that are likely to be requested together.

The compressed data is referenced using pointers in indirect block 460. For example, indirect block 460 may include six pointers, with one pointer referencing each of the six data blocks in the compression group 440.

The compression group is identified using compression group delimiters, such as compression header 471 and compression trailer 472. The compression group delimiters are metadata stored in indirect block 460. For example, compression header 471 is associated with pointer 461 and identifies data block 441 as the initial block of a six kb compression group. Compression trailer 472 is associated with pointer 462 and identifies data block 442 as the final block of the 6 kb compression group. In one embodiment, the compression group 440 is associated with both a compression header 471 and a compression trailer 472. In an alternative embodiment, the compression group 440 is associated with only one of a compression header 471 or a compression trailer 472. For example, the compression header 471 may include metadata indicating the size of the compression group, or may otherwise identify the data block 442 as the final block of the compression group so that a compression trailer 472 is not required.

In one embodiment, the compression header 471 also contains metadata including a compression algorithm used to compress the data in compression group 440. For example, the compression header 471 may indicate that the data in compression group 440 is compressed using a lossless compression algorithm, such as a gzip or zip algorithm. In one embodiment, the data may be compressed using a lossy compression algorithm, such as Joint Picture Experts Group (JPEG) or Motion Picture Experts Group (MPEG) encoding.

Figure 5:
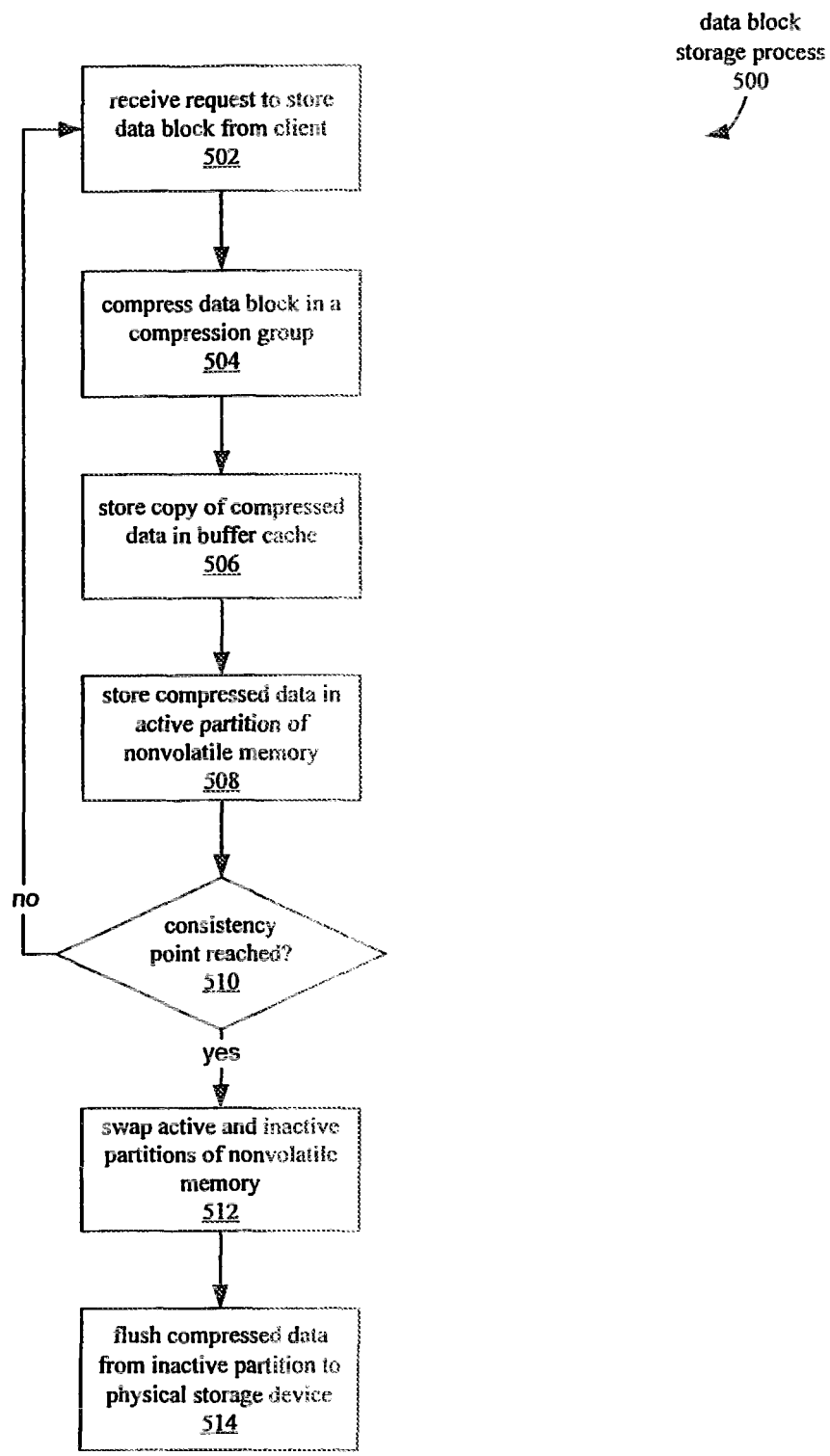
FIG. 5 is a flow chart illustrating a process for storing a data block, according to one embodiment.

FIG. 5 illustrates a data block storage process 500 for storing a data block onto a physical storage device, such as physical storage device 120, according to one embodiment. The operations of data block storage process 500 are performed by a storage server, such as storage server 100.

At block 502, the storage server receives a request to store a data block from a client. For example, a client 140 may transmit a request to store a data block through a network to storage server 100. The request and the data block are received at network adapter 126, which forwards the data block to compression module 101.

At block 504, the storage server compresses the data block received from the client into a compression group. The storage server 100 compresses the data block using compression module 101. Compression module 101 applies a compression algorithm to the data block to generate a compressed version of the data block. In one embodiment, compression module 101 compresses the data block, along with other data blocks, into a compression group. For example, compression module 101 may compress data from a group of eight data blocks into six data blocks. Other embodiments may use different compression ratios and the sizes of compression groups.

At block 506, the storage server stores a copy of the compressed data in a buffer cache. In one embodiment, the compression module stores a copy of the compressed data to buffer cache 102 by storing one or more compression groups containing the compressed data to the buffer cache 102. Data that is stored in the buffer cache 102 can be served quickly in response to a request from client 140.

At block 508, the storage server also stores the compressed data in an active partition of a nonvolatile memory. In one embodiment, the compression module 101 stores compressed data in the active partition 111 by storing one or more compression groups containing the compressed data in the active partition 111. In one embodiment, the compression module 101 stores on the active partition 111 compressed versions of data blocks received from the client 140 that are to be ultimately stored on physical storage device 120 according to a request from client 140.

At block 510, the storage server determines whether a consistency point has been reached. In one embodiment, a consistency point is an event at which data received from a client 140 that has been stored on the NVM 110 since a previous consistency point is flushed to a physical storage device 120. A storage system 100 may be configured so that consistency points occur at periodic intervals, and storage system 100 determines that a consistency point is reached upon the lapse of each time interval. Alternatively, a consistency point may be triggered by a condition or event. For example, a consistency point may occur when the active partition 111 of the NVM 110 runs out of space, or when the storage server 100 is preparing to shut down.

At block 510, if a consistency point has not been reached, the process 500 returns back to block 502. Thus, blocks 502, 504, 506, 508, and 510 may be repeated until a consistency point is reached. Accordingly, multiple requests from clients for storing data blocks may be accumulated in the NVM 110 over time until a consistency point is reached.

At block 510, if the storage server determines that a consistency point has been reached, the process 500 proceeds to block 512. At block 512, the storage server swaps the active and inactive partitions of the nonvolatile memory. In one embodiment, the storage server 100 swaps the partitions 111 and 112 by updating metadata, such as a flag or a register indicating whether each partition is active or inactive. The storage server 100 can read this metadata when writing a data block to the NVM 110 to identify that partition that is the active partition 111, to which the data block is to be written. Similarly, the storage server 100 can read the metadata at a consistency point to identify the partition that is the inactive partition 112, from which data is to be flushed to the physical storage device 120.

At block 514, the storage server flushes the compressed data to the physical storage device. The compressed data is flushed to the physical storage device from the inactive partition. For example, the storage server 100 may flush the compressed data to the physical storage device 120 by copying entire compression groups to the physical storage device. The compressed data, when stored on the physical storage device 120, is available for retrieval when requested by a client.

Figure 6:
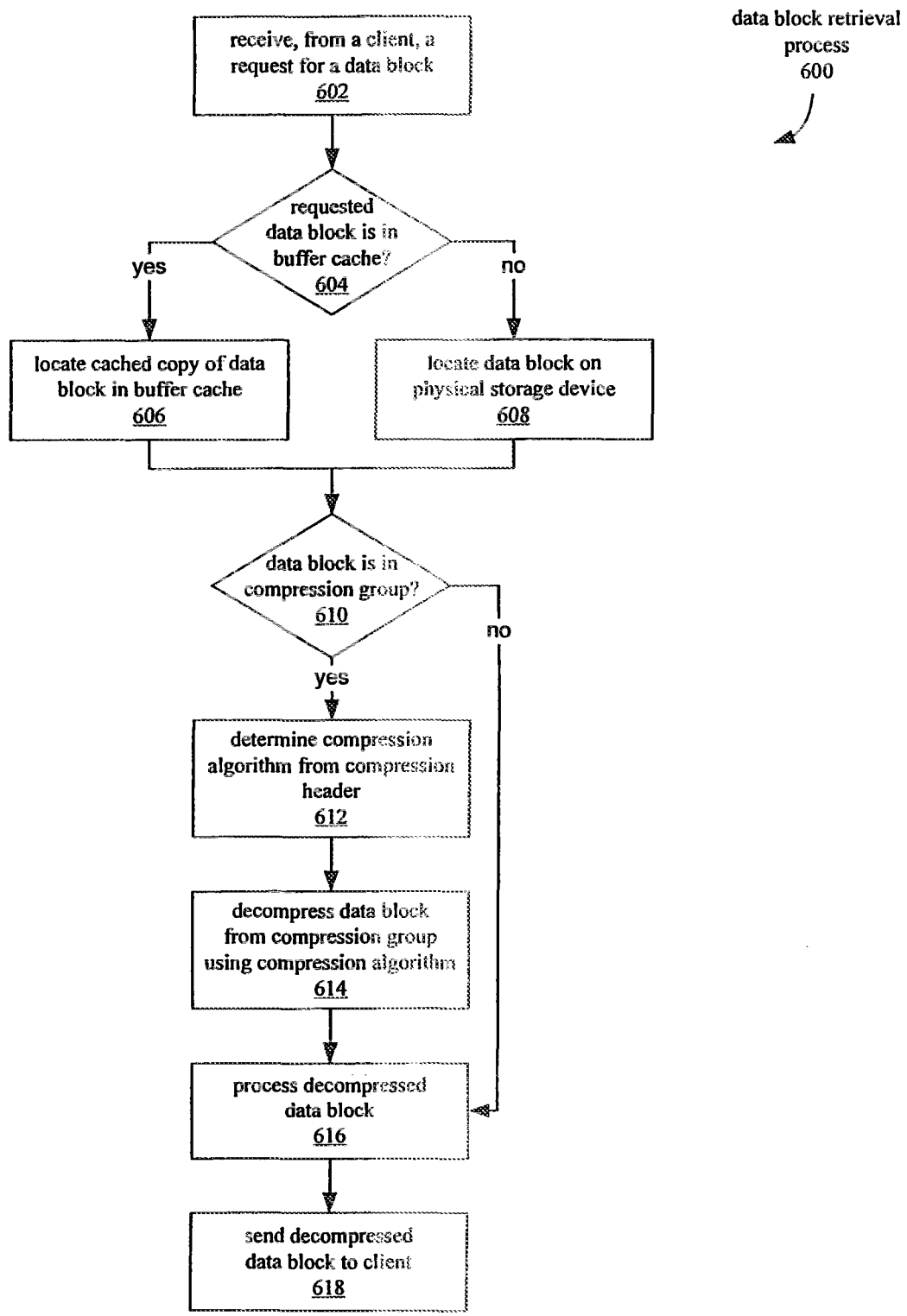
FIG. 6 is a flow chart illustrating a process for retrieving a data block, according to one embodiment.

FIG. 6 illustrates a process 600 for retrieving a data block from a physical storage device, according to one embodiment. The data block retrieval process 600 may be performed by a storage server 100 in response to a request from client 140 for a data block, or in response to a request to perform an operation on a data block.

At block 602, the storage server 100 receives a request from a client for a data block. The client may request a copy of the data block directly, or may also request that an operation be performed on the data block. In an alternative embodiment, the request originates from a process in the storage server, rather than from a client.

The storage server 100 receives a request from a client 140 at network adapter 126. The request is forwarded by the network adapter 126 to the processor 122.

At block 604, the storage server determines whether the requested data block is residing in the buffer cache. For example, the storage server 100 may look up the data block in metadata associated with the buffer cache, such as a table that indicates which data blocks are being stored in the buffer cache.

If the storage server determines that the requested data block is in the buffer cache, the process 600 proceeds to block 606. At block 606, the storage server locates the cached copy of the data block in the buffer cache.

If the storage server determines that the requested data block is not in the buffer cache, the process 600 proceeds to block 608. At block 608, the storage server locates the requested data block on the physical storage device.

At block 610, the storage server determines whether the data block is in a compression group. In one embodiment, the storage server uses the location of the data block determined in block 606 or 608 and examines adjacent data blocks to determine whether the requested data block is within a compression group. For example, a storage server 100 may determine whether a compression group delimiter, such as a compression header 471 or a compression trailer 472, is associated with any data block located within a certain distance from the requested data block.

For example, if the maximum size of a compression group is six data blocks, the storage server may search for a compression group delimiter within six data blocks in either direction (increasing address or decreasing address) of the requested data block located in process block 606 or 608. The presence of such a compression group delimiter indicates that the requested data block is in a compression group.

Alternatively, the storage server may determine if the requested data block is in a compression group by reading other metadata, such as a bitmap having bits set that correspond to compressed data blocks. In another embodiment, the storage server may check for a flag associated with a logical data container, such as a file or volume, indicating that all data blocks of the particular data container are compressed.

At block 612, the storage server determines the appropriate compression algorithm to use for decompressing the data block from the compression group. The compression algorithm used to compress data blocks in the compression group is stored in the compression header 471 or the compression trailer 472. In alternative embodiments, the algorithm may be identified in metadata located elsewhere, or the storage server may simply use a default compression algorithm instead of checking for an algorithm identified in metadata. The compression algorithm may be any of a number of lossless (gzip, LZW, etc.) or lossy (JPEG, MPEG. etc.) compression algorithms.

At block 614, the storage server decompresses the data block from the compression group using the compression algorithm determined in block 612. This decompression is performed by compression module, such as compression module 101.

At block 616, the storage server processes the uncompressed data block, as necessary. In cases where the client has requested an unprocessed data block, the process 600 may not perform any processing at block 616. Alternatively, if the client has requested that some operation be performed on the data block, the operation may be performed at block 616. For example, the uncompressed data block may still be encrypted, and the client may have requested a decrypted version of the data block. In this situation, the decryption of the data block may be performed at block 616. The storage server may also perform operations on the data at block 616 that are not requested by the client. For example, the storage server may automatically compute a fingerprint for the uncompressed data block.

At block 618, the requested data block is returned to the requesting client in uncompressed form. If the client 140 had requested an unprocessed data block, the unprocessed data block is returned to the client 140 through network adapter 126. Alternatively, the storage server 100 may return to the client 140 an uncompressed data block resulting from the operations performed at block 616.

In one embodiment, the data is decompressed from the buffer cache 102 or the physical storage device 120 to a temporary buffer, so that the compressed version of the data remains in the buffer cache 102 or the physical storage device 120. The decompressed data is served to the client from the temporary buffer, or operations may be performed on the decompressed data while the data is in the temporary buffer.

Embodiments of the present invention thus improve performance of a storage server by storing compressed data in memory. Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention.

It will be appreciated that certain embodiments of the present invention may be implemented with solid-state memories including flash storage devices constituting storage server 100. For example, compression module 101 may be operative with non-volatile, solid-state NAND flash devices which are block-oriented devices having good (random) read performance, i.e., read operations to flash devices are substantially faster than write operations. Data stored on a flash device are accessed (e.g., via read and write operations) in units of pages, which in the present embodiment are 4 kB in size, although other page sizes (e.g., 2 kB) may also be used.

When the flash storage devices are organized as one or more parity groups in a RAID array, the data is stored as stripes of blocks within the parity groups, wherein a stripe may constitute similarly located flash pages across the flash devices. For example, a stripe may span a first page 0 on flash device 0, a second page 0 on flash device 1, etc. across the entire parity group with parity being distributed among the pages of the devices. Note that other RAID group arrangements are possible, such as providing a RAID scheme wherein every predetermined (e.g., 8th) block in a file is a parity block.

Moreover, the description of FIGS. 1 and 2 are intended to provide an overview of computer hardware and other operating components suitable for performing the methods of the invention described above, but is not intended to limit the applicable environments. One of skill in the art will immediately appreciate that the invention can be practiced with other computer system configurations. The invention can also be practiced in distributed computing environments where tasks are performed by remote processing devices that are linked through a communications network.

It will be readily apparent to one of skill, that input/output devices, such as a keyboard, a pointing device, and a display, may be coupled to the storage server. These conventional features have not been illustrated for sake of clarity.

The present invention also relates to an apparatus for performing the operations described herein. This apparatus may be specially constructed for the required purposes, or it may comprise a general-purpose computer selectively activated or reconfigured by a computer program stored in the computer. Such a computer program may be stored in a computer readable storage medium. such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions.

The computer-executable instructions may be written in a computer programming language or may be embodied in firmware logic or in hardware circuitry. If written in a programming language conforming to a recognized standard, such instructions can be executed on a variety of hardware platforms and for interface to a variety of operating systems (e.g., Write Anywhere File Layout (WAFL) system provided by Network Appliance, Inc. of Sunnyvale, Calif.). In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, process, application, module, logic . . . ), as taking an action or causing a result. Such expressions are merely a shorthand way of saying that execution of the software by a computer causes the processor of the computer to perform an action or produce a result. It will be further appreciated that more or fewer processes may be incorporated into the method illustrated in FIGS. 5 and 6 without departing from the scope of the invention and that no particular order is implied by the arrangement of blocks shown and described herein.

Some portions of the preceding detailed description are presented in terms of algorithms and symbolic representations of operations on data bits within a computer memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the preceding discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Therefore, it is manifestly intended that this invention be limited only by the following claims and equivalents thereof.

What is claimed is:

1. A computer-implemented method, comprising:
receiving, at a network adapter of a storage controller, a data block to store;
sending, from the network adapter to a compression module of the storage controller, the data block;
in response to receiving the data block from the network adapter, generating, by the compression module, a compressed data block from the data block;
storing, by the compression module, the compressed data block or a reference to the compressed data block in a buffer cache, wherein the storage controller comprises the buffer cache;
storing, by the compression module, the compressed data block in nonvolatile memory, wherein the storage controller comprises the nonvolatile memory;
determining, by the storage controller, that the compressed data block should be flushed to a physical storage device coupled with the storage controller; and
in response to determining that the compressed data block should be flushed to the physical storage device, flushing the compressed data block from the nonvolatile memory to the physical storage device.

2. The computer-implemented method of claim 1, wherein generating the compressed data block comprises:
generating a compression group comprising a plurality of logically related compressed data blocks, wherein the plurality of logically related compressed data blocks comprise the compressed data block.

3. The computer-implemented method of claim 2,
wherein storing the compressed data block in the nonvolatile memory comprises storing the compression group in the nonvolatile memory.

4. The computer-implemented method of claim 1, further comprising, in response to a request to perform an operation on the data block,
reading, by the compression module, the compressed data block from the nonvolatile memory;
decompressing, by the compression module, the compressed data block; and
performing the operation on the data block.

5. The computer-implemented method of claim 1, wherein determining that the compressed data block should be flushed to the physical storage device comprises determining that a consistency point has been reached.

6. The computer-implemented method of claim 2, wherein flushing the compressed data block from the nonvolatile memory to the physical storage device comprises storing the compression group adjacent to an uncompressed data block on the physical storage device.

7. The computer-implemented method of claim 1, further comprising:
receiving a request for the data block;
determining that the compressed data block is in the nonvolatile memory;
in response to determining that the compressed data block is in the nonvolatile memory, reading, by the compression module, the compressed data block from the nonvolatile memory;
decompressing, by the compression module, the compressed data block; and
sending, by the compression module, the compressed data block to the network adapter.

8. A device comprising:
a processor;
nonvolatile memory; and
a computer readable storage medium coupled with the processor, wherein the computer readable storage medium includes instructions which, when executed by the processor, cause the device to:
receive, from a network adapter, a data block to store;
in response to receiving the data block, generating, by a compression module, a compressed data block from the data block;
store, by the compression module, the compressed data block or a reference to the compressed data block in a buffer cache, wherein the device comprises the buffer cache;
store, by the compression module, the compressed data block in nonvolatile memory;
determine that the compressed data block should be flushed to a storage device coupled with the device; and
in response to a determination that the compressed data block should be flushed to the storage device, flush the compressed data block from the nonvolatile memory to the storage device.

9. The device of claim 8, wherein instructions which, when executed by the processor, cause the device to generate the compressed data block comprise instructions which, when executed by the processor, cause the device to generate a compression group comprising a plurality of logically related compressed data blocks, wherein the plurality of logically related compressed data blocks comprise the compressed data block.

10. The device of claim 9, wherein the instructions which, when executed by the processor, cause the device to store the compressed data block in the nonvolatile memory comprise instructions which, when executed by the processor, cause the device to:
store the compression group in the nonvolatile memory.

11. The device of claim 8, wherein the instructions which, when executed by the processor, cause the device to determine that the compressed data block should be flushed to the storage device comprise instructions which, when executed by the processor, cause the device to:
determine that a consistency point has been reached.

12. The device of claim 9, wherein the instructions which, when executed by the processor, cause the device to flush the compressed data block from the nonvolatile memory to the storage device comprise instructions which, when executed by the processor, cause the device to store the compression group adjacent to an uncompressed data block on the storage device.

13. The device of claim 9, wherein the computer readable storage medium further includes instructions which, when executed by the processor, cause the device to:
in response to a request to perform an operation on the data block,
read, by the compression module, the compressed data block from the nonvolatile memory;

decompress, by the compression module, the compressed data block; and perform the operation on the data block.

14. A non-transitory computer readable storage medium having computer usable program code embodied therewith, the computer usable program code comprising computer usable program code to:

receive, from a network adapter of a storage controller, a data block to store;

in response to receiving the data block, generate, by a compression module of the storage controller, a compressed data block from the data block;

store, by the compression module, the compressed data block or a reference to the compressed data block in a buffer cache, wherein the storage controller comprises the buffer cache;

store, by the compression module, the compressed data block in nonvolatile memory, wherein the storage controller comprises the nonvolatile memory;

determine that the compressed data block should be flushed to a storage device coupled with the device; and in response to a determination that the compressed data block should be flushed to the storage device, flush the compressed data block from the nonvolatile memory to the storage device.

15. The computer readable storage medium of claim 14, wherein the computer usable program code to generate the compressed data block comprises computer usable program code to:

generate a compression group comprising a plurality of compressed data blocks, wherein the plurality of compressed data blocks comprise the compressed data block.

16. The computer readable storage medium of claim 15, wherein the computer usable program code to store the compressed data block in the nonvolatile memory comprises computer usable program code to:

store the compression group in the nonvolatile memory.

17. The computer readable storage medium of claim 14, wherein the computer usable program code to determine that the compressed data block should be flushed to the storage device comprises computer usable program code to:

determine that a consistency point has been reached.

18. The computer readable storage medium of claim 15, wherein the computer usable program code to flush the compressed data block from the nonvolatile memory to the storage device comprises computer usable program code to store the compression group adjacent to an uncompressed data block on the storage device.

19. The computer readable storage medium of claim 16, wherein the computer usable program code further comprises computer usable program code to:

in response to a request to perform an operation on the data block, read, by the compression module, the compressed data block from the nonvolatile memory;

decompress, by the compression module, the compressed data block; and perform the operation on the data block.

20. The computer readable storage medium of claim 14, wherein the computer usable program code further comprises computer usable program code to:

receive a request for the data block;

determine that the compressed data block is in the nonvolatile memory;

in response to a determination that the compressed data block is in the nonvolatile memory, read, by the compression module, the compressed data block from the nonvolatile memory;

decompress, by the compression module, the compressed data block; and send, by the compression module, the compressed data block to the network adapter.

* * * * *